United States Patent
Kim et al.

(10) Patent No.: US 7,989,244 B2
(45) Date of Patent: Aug. 2, 2011

(54) METHOD OF MANUFACTURING NITRIDE-BASED SEMICONDUCTOR LIGHT-EMITTING DEVICE

(75) Inventors: Kyoung-kook Kim, Yongin-si (KR); Kwang-ki Choi, Yongin-si (KR); June-o Song, Yongin-si (KR); Suk-ho Yoon, Yongin-si (KR); Kwang-hyeon Baik, Yongin-si (KR); Hyun-soo Kim, Yongin-si (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 546 days.

(21) Appl. No.: 11/802,482

(22) Filed: May 23, 2007

(65) Prior Publication Data
US 2008/0038857 A1    Feb. 14, 2008

(30) Foreign Application Priority Data
Aug. 11, 2006    (KR) .................. 10-2006-0076368

(51) Int. Cl.
*H01L 21/00*    (2006.01)
(52) U.S. Cl. ....... 438/46; 438/47; 438/38; 257/E21.097; 257/E21.351

(58) Field of Classification Search .................. 438/38, 438/46, 47; 257/E21.097, E21.351
See application file for complete search history.

(56) References Cited

U.S. PATENT DOCUMENTS

| | | | |
|---|---|---|---|
| 6,890,779 B2 * | 5/2005 | Toda et al. | 438/22 |
| 2004/0012032 A1 * | 1/2004 | Toda et al. | 257/103 |
| 2005/0029539 A1 * | 2/2005 | Toda et al. | 257/103 |
| 2006/0255341 A1 * | 11/2006 | Pinnington et al. | 257/79 |

* cited by examiner

*Primary Examiner* — Alexander G Ghyka
*Assistant Examiner* — Seahvosh J Nikmanesh
(74) *Attorney, Agent, or Firm* — Harness, Dickey & Pierce, P.L.C.

(57) ABSTRACT

Provided is a method of manufacturing a nitride-based semiconductor light-emitting device having increased efficiency and increased output properties. The method may include forming a sacrificial layer having a wet etching property on a substrate, forming a protective layer on the sacrificial layer, protecting the sacrificial layer in a reaction gas atmosphere for crystal growth, and facilitating epitaxial growth of a semiconductor layer to be formed on the protective layer, forming a semiconductor device including an n-type semiconductor layer, an active layer, and a p-type semiconductor layer on the protective layer, and removing the substrate from the semiconductor device by wet etching the sacrificial layer.

17 Claims, 3 Drawing Sheets

METHOD OF MANUFACTURING NITRIDE-BASED SEMICONDUCTOR LIGHT-EMITTING DEVICE

PRIORITY STATEMENT

This application claims priority under 35 USC §119 to Korean Patent Application No. 10-2006-0076368, filed on Aug. 11, 2006, in the Korean Intellectual Property Office (KIPO), the entire contents of which are incorporated herein by reference.

BACKGROUND

1. Field

Example embodiments relate to a method of manufacturing a semiconductor light-emitting device. Other example embodiments relate to a method of manufacturing a nitride-based semiconductor light-emitting device having increased efficiency and increased output properties using a comparatively simple and easy process.

2. Description of the Related Art

Among light-emitting devices using a compound semiconductor, for example, a study on the development of nitride (GaN, AlN and/or InN) semiconductor-based light-emitting devices has proceeded. Many light-emitting products, e.g., light emitting diodes (LED), laser diodes (LD) and/or back light units (BLU), for a flat panel display have been developed and are commercially used.

Because the demand for a product with increased brightness using an improved optical efficiency property has rapidly increased, the development of a product with increased brightness, to which an increased current may be applied, may be required. A representative is a light-emitting device for illumination. Because an increased current is needed in a nitride light-emitting device which has increased brightness, an increased amount of heat may be generated during the operation of the device. Generation of heat is the main factor for reducing the life span of the device. The development of a thermostable light-emitting device may need to be solved to develop a light-emitting device with increased brightness for illumination.

Most light-emitting devices using a nitride semiconductor may be manufactured by growing a nitride thin film on a sapphire substrate. The sapphire substrate remains with the nitride thin film continuously after the light-emitting device has been manufactured. Because the remaining sapphire substrate has a lower thermal conductivity than that of the nitride semiconductor, heat generated, when the nitride light-emitting device operates, may not be sufficiently dissipated. The temperature of the nitride thin film that constitutes the light-emitting device may be increased, reducing the life span and efficiency of the light-emitting device. The best solution for heat dissipation caused by the decreased thermal conductivity of the sapphire substrate is to remove the sapphire substrate after the nitride light-emitting device is manufactured.

The most used method is laser lift-off (LLO). In this method, a nitride may be separated at an interface between the sapphire substrate and the nitride thin film by irradiating the laser, thereby removing the sapphire substrate from the nitride thin film. The sapphire substrate may be removed using a LLO process. Due to the increased heat generated in the LLO process, the nitride thin film may be damaged. This damage is the main factor for lowering a light property of the nitride thin film and is an inevitable disadvantage in the LLO process.

To perform the LLO process, the nitride thin film may be fixed using an epoxy. In this procedure, if the nitride thin film is not completely adhered to the epoxy, a crack may occur in the nitride thin film during the LLO process of the sapphire substrate. The crack may cause a decrease in the yield of a product and there may be many difficulties in using the product commercially.

SUMMARY

Example embodiments provide a method of manufacturing a nitride-based semiconductor light-emitting device having increased efficiency.

According to example embodiments, a method of manufacturing a nitride-based semiconductor light-emitting device may include forming a sacrificial layer having a wet etching property on a substrate, forming a protective layer on the sacrificial layer, protecting the sacrificial layer in a reaction gas atmosphere for crystal growth, and facilitating epitaxial growth of a semiconductor layer to be formed on the protective layer, forming a semiconductor device including an n-type semiconductor layer, an active layer, and a p-type semiconductor layer on the protective layer, and removing the substrate from the semiconductor device by wet etching the sacrificial layer.

The sacrificial layer may be formed of one material consisting of an oxide selected from the group consisting of $SiO_2$, $GeO_2$, and $SnO$, a second oxide including at least one material selected from the group consisting of $ZnO$, $MgO$, $BeO$, $CaO$, $CdO$, $MnO$, $NiO$, $CuO$, $Cu_2O$, $AgO$, $Ag_2O$, and $WO_3$, a third oxide including at least one material selected from the group consisting of $Cr_2O_3$, $CrO_3$, $Al_2O_3$, $In_2O_3$, $B_2O_3$, $Ga_2O_3$, $Ti_2O_3$, and $CoO$, and a fourth oxide including at least one material selected from the group consisting of indium tin oxide (ITO), $In_xZn_{(1-x)}O$ (IZO), Al-doped ZnO (AZO), and ZnMgO. Alternatively, the sacrificial layer may be formed of one material selected from the group consisting of silicon nitride (SiN), silicon oxynitride (SiON), and ZnS.

The protective layer may be formed of one material selected from the group consisting of SiC, GaAs, AlAs, InAs, AlGaAs, Group-III nitride, and Group-IV nitride. The Group-III nitride may include at least one material selected from the group consisting of GaN, AlN, InN, TiN, BN, TiN, InGaN, and AlGaN. The Group-IV nitride may include at least one material selected from the group consisting of SiN, CN, and SiCN.

According to example embodiments, the nitride-based semiconductor light-emitting device having increased efficiency and increased output properties may be manufactured using a comparatively simple and easy process.

BRIEF DESCRIPTION OF THE DRAWINGS

Example embodiments will be more clearly understood from the following detailed description taken in conjunction with the accompanying drawings.

FIGS. 1-2F represent non-limiting, example embodiments as described herein.

FIG. 1 is a cross-sectional view of a nitride-based semiconductor light-emitting device manufactured according to example embodiments; and FIGS. 2A-2F illustrate a method of manufacturing a nitride-based semiconductor light-emitting device according to example embodiments.

DETAILED DESCRIPTION OF EXAMPLE EMBODIMENTS

Figure 1:
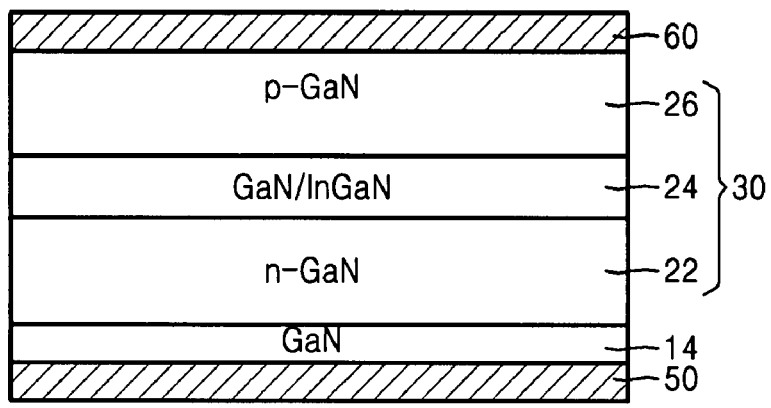

Example embodiments will now be described more fully with reference to the accompanying drawings, in which example embodiments are shown. In the drawings, the thicknesses of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a nitride-based semiconductor light-emitting device manufactured according to example embodiments. Referring to FIG. 1, the nitride-based semiconductor light-emitting device may include a protective layer 14 and a semiconductor device 30 including an n-type semiconductor layer 22, an active layer 24, and a p-type semiconductor layer 26, which are sequentially stacked on the protective layer 14. An n-electrode 50 and a p-electrode 60 may be formed on a bottom surface of the protective layer 14 and on a top surface of the p-type semiconductor layer 26, respectively.

In the nitride-based semiconductor light-emitting device having the above structure, if a predetermined or given voltage is applied between the n-electrode 50 and the p-electrode 60, electrons and holes may flow into the active layer 24 from the n-type semiconductor layer 22 and the p-type semiconductor layer 26, respectively. The electrons and the holes may coalesce within the active layer 24 so that an optical output may be generated from the active layer 24. For example, because the nitride-based semiconductor light-emitting device manufactured to have the structure of FIG. 1 does not include a substrate but includes only a nitride thin film, the problem of heat dissipation generated, when the nitride-based semiconductor light-emitting device operates, may be solved. A light-emitting device, e.g., a light emitting diode (LED) and/or a laser diode (LD), having increased efficiency and increased output properties, may be manufactured. A detailed description of the material of respective material layers and a method for forming the same will be omitted, and the material of respective material layers and the method for forming the same will be described together with a detailed description of a method of manufacturing a nitride-based semiconductor light-emitting device according to example embodiments.

Figure 2A:
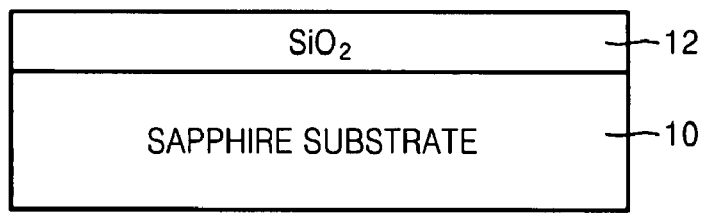

FIGS. 2A-2F illustrate a method of manufacturing a nitride-based semiconductor light-emitting device according to example embodiments. Referring to FIG. 2A, a sacrificial layer 12, having an improved wet etching property for chemical lift-off, may be formed on a substrate 10 that may be generally used in a semiconductor manufacturing process, e.g., a sapphire substrate, an Si substrate, a GaAs substrate and/or an SiC substrate.

The sacrificial layer may be formed of one material selected from the group consisting of a first oxide including at least one material selected from the group consisting of $SiO_2$, $GeO_2$ and/or SnO, a second oxide including at least one material selected from the group consisting of ZnO, MgO, BeO, CaO, CdO, MnO, NiO, CuO, $Cu_2O$, AgO, $Ag_2O$ and/or $WO_3$, a third oxide including at least one material selected from the group consisting of $Cr_2O_3$, $CrO_3$, $Al_2O_3$, $In_2O_3$, $B_2O_3$, $Ga_2O_3$, $Ti_2O_3$ and/or CoO, and a fourth oxide including at least one material selected from the group consisting of indium tin oxide (ITO), $In_xZn_{(1-x)}O$ (IZO), Al-doped ZnO (AZO) and/or ZnMgO. Alternatively, the sacrificial layer may be formed of one material selected from the group consisting of silicon nitride (SiN), silicon oxynitride (SiON) and/or ZnS. A material having an improved wet etching property other than the above-described materials may be used in forming the sacrificial layer 12.

When the sacrificial layer 12 is formed of $SiO_2$, a relatively stable property, in which the sacrificial layer 12 is not etched and a sufficient corrosion resistance is shown in a growth atmosphere of a nitride thin film using metal organic chemical vapor deposition (MOCVD), for example, in an increased temperature and increased pressure hydrogen atmosphere, may be shown. The sacrificial layer 12 may be formed using ZnO on the sapphire substrate 10. The quality of the nitride thin film grown on the ZnO thin film may be improved. Because the ZnO thin film has a wurzite crystalline structure, e.g., a nitride semiconductor, and a difference in lattice parameter is just about 2%, when a high-quality ZnO thin film is grown, a high-quality nitride thin film, having improved crystallinity, may be grown on the ZnO thin film. Growth of the high-quality nitride thin film is essential to manufacture an optical device with increased quality.

The sacrificial layer 12 may be formed by vapor deposition including chemical vapor deposition (CVD) and/or physical vapor deposition (PVD), for example, by plasma enhanced chemical vapor deposition (PECVD) and/or sputtering. For example, increased temperature thin film growth caused by sputtering may be used to form the high-quality ZnO thin film. The ZnO thin film, having improved crystallinity and improved optical property, may be grown. For example, the sputtering may enable increased area thin film growth and a growth speed may be increased, which is advantageous for mass production.

The sacrificial layer 12 may be formed to a thickness of about 0.01 μm-about 20 μm. When the sacrificial layer 12 is equal to or less than about 0.01 μm, in a subsequent wet etching process, selective etching of the sacrificial layer 12 may be difficult and controlling an etching time may also be difficult. When the sacrificial layer 12 is equal to or greater than about 20 μm, the etching time of the sacrificial layer 12 may be lengthened. The thickness of the sacrificial layer 12 may be limited to about 0.01 μm-about 20 μm.

After the sacrificial layer 12 is formed, the sacrificial layer 12 may be annealed in a gas atmosphere including at least one material selected from the group consisting of nitrogen, oxygen, and argon and/or a vacuum atmosphere, thereby improving surface roughness of the sacrificial layer 12. The annealing may include maintaining the sacrificial layer 12 at a temperature of about 100° C.-about 1400° C. for about 0.1 minutes-about 180 minutes. Rapid thermal annealing (RTA), in which the annealing temperature may be achieved by increasing the temperature of a reaction chamber (not shown) in which the substrate 10 is mounted at a ratio of about 1° C.-about 100° C. per second, may be performed.

Figure 2B:
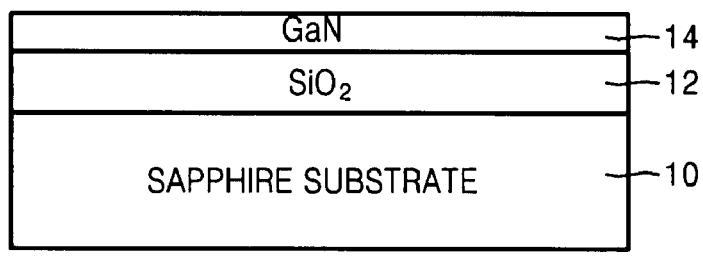

Referring to FIG. 2B, a protective layer 14 may be formed of one material selected from the group consisting of SiC, GaAs, AlAs, InAs, AlGaAs, Group-III nitride, and Group-IV nitride. The protective layer 14 may serve to protect the sacrificial layer 12 in a reaction gas atmosphere for crystal growth of a nitride thin film, for example, in an increased temperature and increased pressure hydrogen atmosphere and to facilitate epitaxial growth of the semiconductor layer to be formed on the protective layer 14. The protective layer 14 may also function as a seed layer for epitaxial growth of a nitride thin film to be formed on the protective layer 14.

The Group-III nitride may include at least one material selected from the group consisting of GaN, AlN, InN, TiN, BN, TiN, InGaN, and AlGaN. The Group-IV nitride may include at least one material selected from the group consisting of SiN, CN, and SiCN. The protective layer 14 may be formed by physical vapor deposition (PVD), for example, by sputtering, molecular beam epitaxy (MBE) and/or evaporation. The sputtering may enable increased area thin film growth and a growth speed may be increased, which is advantageous for mass production.

The protective layer 14 may be formed to a thickness of about 0.01 μm-about 20 μm. When the protective layer 14 is equal to or less than about 0.01 μm, the sacrificial layer 12 may not be properly protected in a reaction gas atmosphere for crystal growth of the nitride thin film, for example, in an increased temperature and increased pressure hydrogen atmosphere so that the sacrificial layer 12 may be damaged. Because it is sufficient that the protective layer 14 has a minimum thickness required to protect the sacrificial layer 12 and to function as a seed layer, the thickness of the protective layer 14 may not need to be equal to or greater than about 20 μm.

After the protective layer 14 is formed, the protective layer 14 may be annealed in a gas atmosphere including at least one material selected from the group consisting of nitrogen, oxygen, and argon and/or a vacuum atmosphere, so that a surface roughness property of the protective layer 14 and crystallinity may be improved. The annealing may include maintaining the protective layer 14 at a temperature of about 100° C.-about 1400° C. for about 0.1 minutes-about 180 minutes. Rapid thermal annealing (RTA), in which the annealing temperature is achieved by increasing the temperature of a reaction chamber (not shown) in which the substrate 10 is mounted at a ratio of about 1° C.-about 100° C. per second, may be performed.

As a conventional method of growing a nitride thin film, increased area and increased capacity thin film growth may be performed, and for example, due to an improved property of the grown nitride thin film, the nitride thin film may be grown using metal organic chemical vapor deposition (MOCVD). When the nitride thin film, for example, a GaN thin film, is grown by MOCVD, an ammonia ($NH_3$) and/or hydrozine ($NH_2$) gas may be used as an "N" source and trimethylgallium (TMGa) may be used as a "Ga" source. Hydrogen ($H_2$) may be used as a carrier gas for carrying TMGa. When the sacrificial layer 12 is formed of ZnO, $H_2$, used as the carrier gas, may be disadvantageous in forming the ZnO thin film. $H_2$, generated when $NH_3$ and/or $NH_2$ is decomposed, may also be disadvantageous in forming the ZnO thin film. The ZnO thin film may exist in a reduction atmosphere due to $NH_3$ and/or $H_2$ used in MOCVD and the ZnO thin film may be dry etched. For example, the dry etching speed may be rapid and the ZnO thin film, having a thickness of about 1 μm in the $NH_3$ and $H_2$ gas atmosphere at a temperature of equal or greater than about 500° C. within about 5 minutes, may be etched and disappear. Because the ZnO thin film is etched before the nitride thin film is grown, growth of the nitride thin film, due to MOCVD, on the ZnO thin film may be impossible.

According to example embodiments, because the nitride thin film is grown on the sacrificial layer 12 by increased temperature sputtering, the GaN protective layer 14 may be formed on the ZnO sacrificial layer 12. The nitride thin film may be grown on the GaN protective layer 14 by MOCVD. In this procedure, the GaN protective layer 14 may serve to suppress an etching phenomenon of the ZnO sacrificial layer 12 in the $NH_3$ and $H_2$ gas atmosphere and may function as a seed layer for facilitating epitaxial growth of the nitride thin film. The high-quality nitride thin film may be grown on the ZnO thin film by MOCVD.

According to example embodiments, in order to solve the problem in that the ZnO thin film may be weak in the $H_2$ atmosphere, the sacrificial layer 12 may be formed of $SiO_2$. The ZnO thin film may have a relatively decreased lattice mismatch with the nitride thin film, and thus, may be advantageous to high-quality nitride thin film growth. When the ZnO thin film is exposed to an atmosphere of an increased temperature of equal to or greater than about 1000° C. and an $H_2$ atmosphere for growth of the nitride thin film, there may be etching of the ZnO thin film by $H_2$ and the resistance to temperature may not be stable. A portion of the ZnO thin film may be etched and oxygen may be generated. Oxygen may be doped into the nitride thin film and thus, a property of the nitride thin film may be deteriorated. To solve the problem, there may be a method of forming the sacrificial layer 12 as an $SiO_2$ thin film. $SiO_2$ is a material whose stability is verified in a nitride thin film growth atmosphere by MOCVD and may be stable even in an increased temperature of equal to or greater than about 1000° C. and an increased pressure $H_2$ atmosphere. When the sacrificial layer 12 is formed of $SiO_2$, an etch-resistant property, with respect to the $H_2$ gas while the nitride thin film is grown, may be sufficiently strong.

When using MOCVD, it may be impossible to thermodynamically grow the nitride thin film on the $SiO_2$ thin film. A thin film that functions as a seed layer for growth of the nitride thin film may be further formed on the $SiO_2$ thin film. There may be thin film growth of a nitride-based thin film for a buffer enabling growth of a high-quality nitride thin film and/or SiC. The thin film growth may be PVD, e.g., sputtering. In example embodiments, the AlN and/or GaN thin film may be grown by sputtering on the $SiO_2$ thin film for growth of the nitride thin film, and the nitride thin film may be grown on the GaN thin film by MOCVD.

Figure 2C:
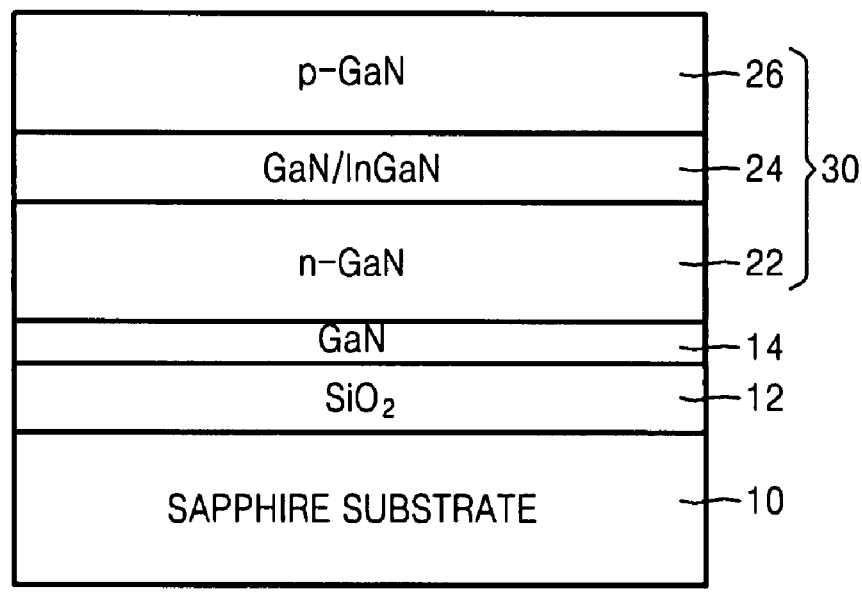

Referring to FIG. 2C, a semiconductor device 30, including an n-type semiconductor layer 22, an active layer 24, and a p-type semiconductor layer 26, may be formed on the protective layer 14. Each of the n-type semiconductor layer 22, the active layer 24, and the p-type semiconductor layer 26, which constitute the semiconductor device 30, may be formed by MOCVD. For example, a GaN-based thin film may be formed by reacting TMGa with $NH_3$ in an MOCVD process.

The n-type semiconductor layer 22 may be formed of an AlInGaN-based Group III-V-nitride semiconductor material, for example, an n-GaN layer. The n-type semiconductor layer 22 may be formed on the protective layer 14 by homo epitaxy growth and/or hetero epitaxy growth. The p-type semiconductor layer 26 may be a p-GaN-based Group III-V nitride semiconductor layer, for example, a p-GaN layer and/or a p-GaN/AlGaN layer.

The active layer 2r may be a GaN-based Group III-V-nitride semiconductor layer which is $In_xAl_yGa_{1-x-y}N$ ($0 \leq x \leq 1$, $0 \leq y \leq 1$ and $0 \leq x+y \leq 1$), for example, an InGaN layer and/or an AlGaN layer. The active layer 24 may be formed of one structure of a multi-quantum well (hereinafter, referred to as 'MQW') and a single quantum well. The structure of the active layer 24 does not limit the technical scope of example embodiments. For example, the active layer 24 may be formed of a GaN/InGaN/GaN MQW and/or GaN/AlGaN/GaN MQW structure.

Figure 2D:
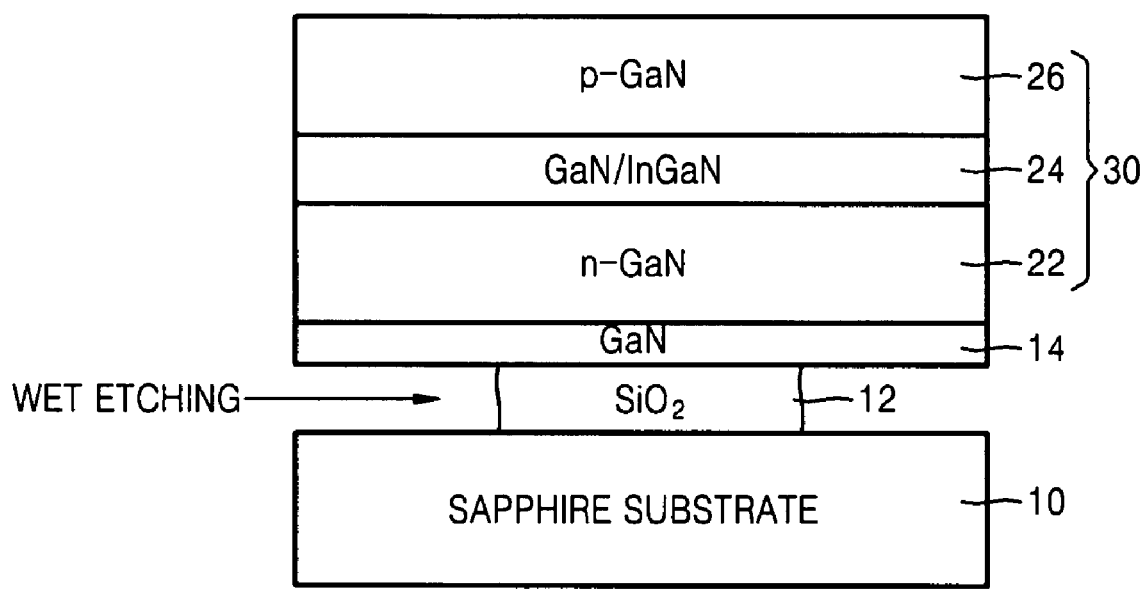
Figure 2E:
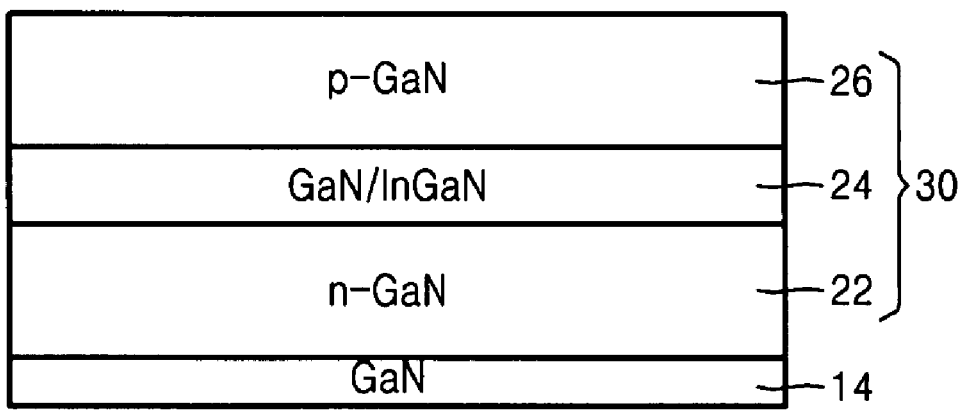

Referring to FIGS. 2D and 2E, the active layer 12 may be selectively wet etched, thereby removing the substrate 10 from the semiconductor device 30. In the wet etching process, an acid- or alkali-based etchant may be used to etch the sacrificial layer 12. For example, the acid-based etchant may include hydrofluoric acid, hydrochloric acid, sulfuric acid, nitric acid and/or phosphoric acid. For example, the sacrificial layer 12 may be selectively wet etched by using the hydrochloric acid solution (which is a mixed solution of hydrochloric acid and water and whose concentration may be about 1%-about 100%). The sapphire substrate 10 and the nitride thin films 14, 22, 24, and 26 may have an improved corrosion resistance with respect to hydrochloric acid. Even if the sapphire substrate 10 and the nitride thin films 14, 22, 24, and 26 are exposed to a hydrochloric acid solution for a relatively long time, the nitride thin films 14, 22, 24, and 26 may not be damaged. For example, because the wet etching process is performed by a chemical reaction, a mechanical force or increased heat may not be supplied from the outside when the substrate 10 is separated from the semiconductor device 30.

Accordingly, the nitride thin film may be separated without being damaged when the semiconductor device 30 is grown on the substrate 10. The substrate 10 may be easily separated and removed from the semiconductor device 30 formed on the substrate 10 by chemical lift-off using the wet etching process. For example, because physical damage does not remain in the semiconductor device 30, an optical output of the nitride-based semiconductor light-emitting device manufactured in this manner may be improved, and for example, an increased yield may be expected. Because the nitride-based semiconductor light-emitting device manufactured in this manner may not include the substrate 10 and may include only the nitride thin film, heat dissipation generated, when the nitride-based semiconductor light-emitting device operates, may be improved.

Because the sapphire substrate 10 has a sufficiently improved corrosion resistance (an acid-resistant property), the sapphire substrate 10 may be cleanly restored and may be reused as a growth substrate for a thin film after the sacrificial layer 12 formed on the substrate 10, for example, an oxide thin film, e.g., ZnO and/or $SiO_2$, is completely removed by wet etching. Therefore, the price of the product may become more competitive.

Figure 2F:
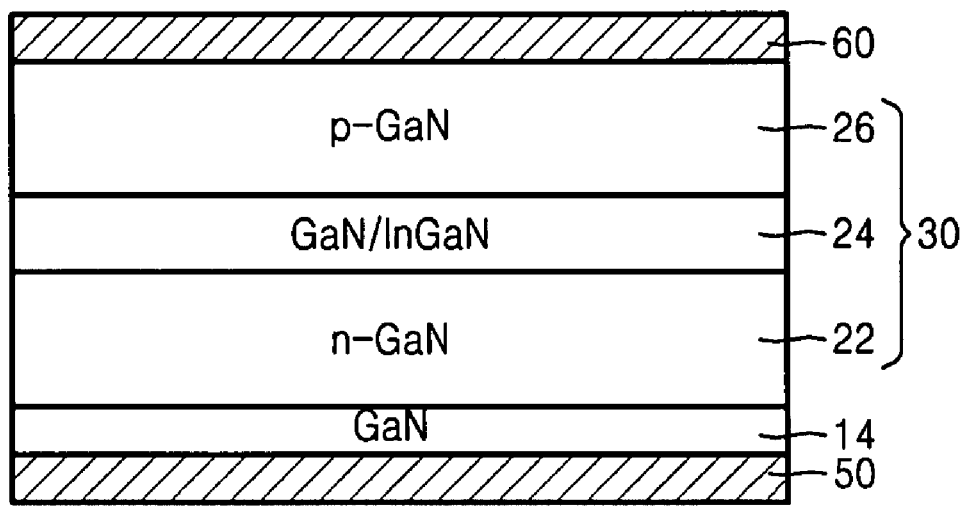

Referring to FIG. 2F, an n-electrode 50 and a p-electrode 60 may be formed using a conductive material, for example, metal, e.g., Au, Al, and Ag and/or a transparent conductive oxide, on the bottom surface of the protective layer 14 and on the top surface of the p-type semiconductor layer 26. The transparent conductive oxide may be one oxide selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and/or $Zn_{(1-x)}Mg_xO$ (Zinc Magnesium Oxide, $0 \leq x \leq 1$), for example, $Zn_2In_2O_5$, $GaInO_3$, $ZnSnO_3$, F-doped $SnO_2$, Al-doped ZnO, Ga-doped ZnO, MgO, and ZnO.

An $SiO_2$ thin film was formed on a sapphire (0001) substrate to a thickness of about 1 μm. The $SiO_2$ thin film was annealed in a nitrogen atmosphere. Specifically, the temperature of a reaction chamber, in which the substrate was mounted, was increased at a ratio of about 20° C.-about 100° C. per second to keep the $SiO_2$ thin film at a temperature of about 900° C. for about 3 minutes. A GaN thin film was grown on the $SiO_2$ thin film by RF magnetron sputtering. A GaN material was used as a source target and a growth temperature of the GaN thin film was kept at room temperature and/or about 750° C. The GaN thin film was annealed in a nitrogen atmosphere. The temperature of the reaction chamber, in which the substrate was mounted, was increased at a ratio of about 20° C.-about 100° C. per second to keep the GaN thin film at a temperature of about 800° C.-about 900° C. for about 1 minute-about 3 minutes.

The substrate, on which the stacked resultant structure was formed, was mounted in an MOCVD reaction chamber so as to grow a nitride thin film on the GaN thin film, and a Ga source and an N source were supplied into the reaction chamber to grow the nitride thin film at a temperature of about 550° C.-about 1000° C., for example, the GaN thin film. TMGa was used as the Ga source, $NH_3$ was used as the N source and nitrogen and/or hydrogen was used as a carrier gas for carrying the Ga source.

The substrate, on which the nitride thin film was formed, was put in a hydrochloric acid and/or nitric acid solution (which is a mixed solution of hydrochloric acid and water and/or a mixed solution of nitric acid and water) and then, the $SiO_2$ thin film was wet etched. The sapphire substrate was completely separated from the nitride thin film. In the wet etching process, the temperature of the hydrochloric acid and/or nitric acid solution was kept at a room temperature or 100° C. and the concentration of the solution was about 1%-about 100%.

According to example embodiments, the nitride-based semiconductor light-emitting device having increased efficiency and increased output properties may be manufactured using a comparatively simple and easy process. The substrate may be easily separated and removed from the semiconductor device formed on the substrate by chemical lift-off. For example, because physical damage does not remain in the semiconductor device in this procedure, an optical output of the nitride-based semiconductor light-emitting device manufactured in this manner may be improved, and for example, an increased yield may be expected. Because the nitride-based semiconductor light-emitting device does not include the substrate but includes only the nitride thin film, heat dissipation generated, when the nitride-based semiconductor light-emitting device operates, may be improved. Accordingly, a light-emitting device having increased efficiency and increased output properties, e.g., a light emitting diode (LED) and/or a laser diode (LD), may be manufactured. Additionally, the technology of example embodiments may be easily applied to the development of other semiconductor devices and thus, an applied range thereof may be relatively wide.

While example embodiments have been particularly shown and described with reference to example embodiments thereof, it will be understood by those skilled in the art that various changes in form and details may be made therein without departing from the spirit and scope of the following claims.

What is claimed is:

1. A method of manufacturing a nitride-based semiconductor light-emitting device, the method comprising:
   forming a sacrificial layer having a wet etching property on a substrate;
   growing a protective layer by the growth of a thin film on an upper surface of the sacrificial layer, protecting the sacrificial layer in a reaction gas atmosphere for crystal growth, and facilitating epitaxial growth of a semiconductor layer to be formed on the protective layer;
   forming a semiconductor device including an n-type semiconductor layer, an active layer, and a p-type semiconductor layer on the protective layer; and
   removing the substrate from the semiconductor device by wet etching the sacrificial layer.

2. The method of claim 1, wherein the sacrificial layer is formed of one material including an oxide selected from the group consisting of $SiO_2$, $GeO_2$, SnO, ZnO, MgO, BeO, CaO, CdO, MnO, NiO, CuO, $Cu_2O$, AgO, $Ag_2O$, $WO_3$, $Cr_2O_3$, $CrO_3$, $Al_2O_3$, $In_2O_3$, $B_2O_3$, $Ga_2O_3$, $Ti_2O_3$, CoO, indium tin oxide (ITO), $In_xZn_{(1-x)}O$ (IZO), Al-doped ZnO (AZO), and ZnMgO.

3. The method of claim 1, wherein the sacrificial layer is formed of one material selected from the group consisting of silicon nitride (SiN), silicon oxynitride (SiON), and ZnS.

4. The method of claim 1, wherein forming the sacrificial layer includes forming the sacrificial layer by vapor deposition including chemical vapor deposition (CVD) or physical vapor deposition (PVD).

5. The method of claim 1, wherein forming the sacrificial layer includes forming the sacrificial layer to a thickness of about 0.01 μm-about 20 μm.

6. The method of claim 1, wherein the protective layer is formed of one material selected from the group consisting of SiC, GaAs, AlAs, InAs, AlGaAs, Group-III-nitride, and Group-IV-nitride.

7. The method of claim 6, wherein the Group-III-nitride includes at least one material selected from the group consisting of GaN, AlN, InN, TiN, BN, TiN, InGaN, and AlGaN.

8. The method of claim 6, wherein the Group-IV-nitride includes at least one material selected from the group consisting of SiN, CN, and SiCN.

9. The method of claim 1, wherein forming the protective layer includes forming the protective layer by physical vapor deposition (PVD).

10. The method of claim 9, wherein the PVD includes sputtering, molecular beam epitaxy (MBE) or evaporation.

11. The method of claim 1, wherein forming the protective layer includes forming the protective layer to a thickness of about 0.01 μm-about 20 μm.

12. The method of claim 1, wherein wet etching the sacrificial layer includes using an acid- or alkali-based etchant that may etch the sacrificial layer selectively.

13. The method of claim 12, wherein the acid-based etchant includes hydrofluoric acid, hydrochloric acid, sulfuric acid, nitric acid or phosphoric acid.

14. The method of claim 1, wherein forming the semiconductor device includes forming the semiconductor device by metal organic chemical vapor deposition (MOCVD).

15. The method of claim 1, wherein the substrate is a sapphire substrate, an Si substrate, a GaAs substrate or an SiC substrate.

16. A method of manufacturing a nitride-based semiconductor light-emitting device, the method comprising:
   mounting a substrate in a reaction chamber;
   forming a sacrificial layer having a wet etching property on the substrate;
   annealing the sacrificial layer in a gas atmosphere including at least one material selected from the group consisting of nitrogen, oxygen, and argon or a vacuum atmosphere by maintaining the sacrificial layer at a temperature of about 100° C. to about 1,400° C. for about 0.1 minute to about 180 minutes and increasing a temperature of the reaction chamber at a ratio of about 1° C. to about 100° C. per second;
   forming a protective layer on the sacrificial layer, protecting the sacrificial layer in a reaction gas atmosphere for crystal growth and facilitating the epitaxial growth of a semiconductor layer to be formed on the protective layer;
   forming a semiconductor device including an n-type semiconductor layer, an active layer, and a p-type semiconductor layer on the protective layer; and
   removing the substrate from the semiconductor device by wet etching the sacrificial layer.

17. A method of manufacturing a nitride-based semiconductor light-emitting device, the method comprising:
   mounting a substrate in a reaction chamber;
   forming a sacrificial layer having a wet etching property on the substrate;
   forming a protective layer on the sacrificial layer, protecting the sacrificial layer in a reaction gas atmosphere for crystal growth and facilitating the epitaxial growth of a semiconductor layer to be formed on the protective layer;
   annealing the protective layer in a gas atmosphere including at least one material selected from the group consisting of nitrogen, oxygen, and argon or a vacuum atmosphere by maintaining the sacrificial layer at a temperature of about 100° C. to about 1,400° C. for about 0.1 minute to about 180 minutes and increasing a temperature of the reaction chamber at a ratio of about 1° C. to about 100° C. per second;
   forming a semiconductor device including an n-type semiconductor layer; an active layer, and a p-type semiconductor layer on the protective layer; and
   removing the substrate from the semiconductor device by wet etching the sacrificial layer.

* * * * *